(12) United States Patent
Park et al.

(10) Patent No.: US 7,869,185 B2
(45) Date of Patent: Jan. 11, 2011

(54) METHOD OF DE-CHUCKING WAFER USING DIRECT VOLTAGE AND ALTERNATING VOLTAGE, AND APPARATUS FOR FABRICATING SEMICONDUCTOR DEVICE USING THE SAME

(75) Inventors: Hae-Joong Park, Suwon-si (KR); Dong-Jun Shin, Uiwang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 195 days.

(21) Appl. No.: 12/222,076

(22) Filed: Aug. 1, 2008

(65) Prior Publication Data

US 2009/0040682 A1 Feb. 12, 2009

(30) Foreign Application Priority Data

Aug. 2, 2007 (KR) ...................... 10-2007-0077793

(51) Int. Cl.
*H01T 23/00* (2006.01)
(52) U.S. Cl. ....................... 361/234; 361/230
(58) Field of Classification Search .......... 361/230–234
See application file for complete search history.

(56) References Cited

U.S. PATENT DOCUMENTS

| | | | | |
|---|---|---|---|---|
| 5,444,597 A * | 8/1995 | Blake et al. | ................. | 361/234 |
| 5,790,365 A * | 8/1998 | Shel | ........................... | 361/234 |
| 6,236,555 B1 * | 5/2001 | Leeser | ........................ | 361/234 |
| 6,500,686 B2 * | 12/2002 | Katata et al. | .................. | 438/22 |
| 2006/0046506 A1 * | 3/2006 | Fukiage | ...................... | 438/758 |

FOREIGN PATENT DOCUMENTS

| | | |
|---|---|---|
| JP | 10-209258 | 8/1998 |
| KR | 100282421 | 11/2000 |
| KR | 1020040105356 | 12/2004 |
| KR | 102005002901 | 3/2005 |

\* cited by examiner

*Primary Examiner*—Danny Nguyen
(74) *Attorney, Agent, or Firm*—Harness, Dickey & Pierce, P.L.C.

(57) ABSTRACT

Example embodiments provide a method of de-chucking a wafer by alternating between using a direct voltage and an alternating voltage, and an apparatus for fabricating a semiconductor device using the same. The method of de-chucking a wafer comprises interrupting a chucking voltage applied to an electrostatic chuck, applying a first de-chucking voltage to the electrostatic chuck, and applying a second de-chucking voltage to the electrostatic chuck.

16 Claims, 6 Drawing Sheets

METHOD OF DE-CHUCKING WAFER USING DIRECT VOLTAGE AND ALTERNATING VOLTAGE, AND APPARATUS FOR FABRICATING SEMICONDUCTOR DEVICE USING THE SAME

FOREIGN PRIORITY STATEMENT

This application claims priority under 35 U.S.C. §119 to Korean Patent Application No. 2007-0077793, filed Aug. 2, 2007, in the Korean Intellectual Property Office, the entire contents of which is hereby incorporated herein by reference.

BACKGROUND

1. Field

Example embodiments relate to a method of treating a wafer and an apparatus for fabricating a semiconductor device employing the same, and more particularly, to a method of de-chucking a wafer using a direct voltage and an alternating voltage, and an apparatus for fabricating a semiconductor device employing the same.

2. Description of Related Art

Semiconductor devices may be manufactured using various unit processes. The unit processes may include a deposition process for forming material layers such as insulating layers, conducting layers or semiconductor layers on a wafer, a photolithography/etching process for patterning the material layers, and an ion implantation process for doping impurities in predetermined regions of the wafer. The unit process may further include a thermal treating process for activating the impurities, a chemical-mechanical polishing process for planarizing surfaces of the material layers, and a cleaning process for removing contaminants remaining on the wafer on which the unit processes above are performed.

Most of the unit processes may be performed in a space separated from an outside environment. Specifically, the depositing process and the etching process may be performed within a chamber having a closed space for surrounding the wafer. In such a case, a chuck may be installed in the chamber for supporting the wafer.

In order to apply the depositing or etching process to the wafer, the wafer may be loaded on the electrostatic chuck. The electrostatic chuck may attract the wafer using an electrostatic force.

After completing the process, the wafer may be unloaded from the electrostatic chuck. In order to unload the wafer from the electrostatic chuck, an electric power applied to the electrostatic chuck may be interrupted so as to eliminate the electrostatic force between the wafer and the electrostatic chuck. However, even when the electric power to the electrostatic chuck is interrupted, the electrostatic power between the wafer and the electrostatic chuck may remain for a predetermined period of time. This is because remaining charges may exist in the wafer and the electrostatic chuck. In the case where the wafer may be physically separated from the electrostatic chuck after interrupting the electric power, the wafer may be damaged or broken due to over-bending or over-stress.

In order to improve the above process, various methods of de-chucking a wafer have been tried. For instance, a voltage applied to electrodes in an electrostatic chuck may be interrupted after completing a process on a wafer. Following the interruption, charges remaining in the electrodes and the wafer may flow out through a grounded chamber. To eliminate the charges remaining between the electrostatic chuck and the electrodes within a short period of time, a voltage having a different polarity from the polarity applied to the electrodes during the process may be applied to the electrostatic chuck. Consequently, the charges remaining in the electrodes may be neutralized such that the electrostatic power between the wafer and the electrostatic chuck may be weakened. However, even when a voltage having a different polarity from the polarity applied to the electrodes during the process is applied to the electrostatic chuck, many charges with polarity that is opposite the polarity applied to the electrodes may be generated. In other words, the electrostatic power between the electrostatic chuck and the wafer may not be completely extinguished, but may only be weakened gradually.

SUMMARY

Example embodiments provide a method of de-chucking a wafer from an electrostatic chuck without any damage.

Example embodiments provide an apparatus for fabricating a semiconductor device suitable for de-chucking a wafer from an electrostatic chuck without any damage.

Example embodiments provide a method of de-chucking a wafer, the method of de-chucking a wafer may include interrupting a chucking voltage applied to an electrostatic chuck, applying a first de-chucking voltage to the electrostatic chuck and applying a second de-chucking voltage to the electrostatic chuck. The first de-chucking voltage has one of a different polarity from the chucking voltage or a zero value. And the second de-chucking voltage varies periodically in polarity.

In example embodiments, when the first de-chucking voltage has a different polarity from the chucking voltage, the first de-chucking voltage may include a direct voltage that has a constant value, or a direct voltage that gradually converges to a zero value from an initial value of more than zero.

In example embodiments, the second de-chucking voltage may include an alternating voltage that has a constant absolute value, or an alternating voltage that converges to a zero value from an initial absolute value of more than zero.

In example embodiments, the second de-chucking voltage may include first, second and third alternating voltages. The first, second and third alternating voltages may be generated at different process time intervals from one another. And the first, second and third alternating voltages may be gradually reduced in order.

In example embodiments, the second de-chucking voltage may include a sine curve, a square wave or a pyramidal wave.

In example embodiments, the method of de-chucking a wafer may further include supplying a de-chucking gas to a backside of the wafer before the application of the first and second de-chucking voltages to the electrostatic chuck, measuring a leakage amount of the de-chucking gas leaked out between the wafer and the electrostatic chuck after the application of the first and second de-chucking voltages to the electrostatic chuck; and de-chucking the wafer from the electrostatic chuck in the case where the measured leakage amount of the de-chucking gas is larger than a tolerance leakage amount thereof.

In example embodiments, the de-chucking gas may include an inert gas.

In example embodiments, the method of de-chucking a wafer may further include before the interruption of the chucking voltage to the electrostatic chuck, loading the wafer on the electrostatic chuck, applying the chucking voltage to the electrostatic chuck, transmitting identifying information of the wafer to a controller; and setting a polarity and a value of the first de-chucking voltage, and a waveform and an absolute value of the second de-chucking voltage based on the identifying information for the wafer.

According to example embodiments, there is an apparatus of fabricating a semiconductor device. The apparatus of fabricating a semiconductor device may include an electrostatic chuck chucking a wafer under a chucking voltage and a de-chucking voltage supplier connected to the electrostatic chuck. The de-chucking voltage supplier includes a first de-chucking voltage supplier and a second de-chucking voltage supplier. The first de-chucking voltage supplier generates a first de-chucking voltage having one of a different polarity from the chucking voltage and a zero value. The second de-chucking voltage supplier generates a second de-chucking voltage varying periodically in polarity.

In example embodiments, when the first de-chucking voltage has a different polarity from the chucking voltage, the first de-chucking voltage may include a direct voltage that has a constant value, or a direct voltage that gradually converges to a zero value from an initial value of more than zero.

In example embodiments, the second de-chucking voltage may include an alternating voltage that has a constant absolute value, or an alternating voltage that converges to a zero value from an initial absolute value of more than zero.

In example embodiments, the second de-chucking voltage may include first, second and third alternating voltages. The first, second and third alternating voltages may be respectively generated at different process time intervals from one another, and the first, second and third alternating voltages may be gradually reduced in order.

In example embodiments, the second de-chucking voltage may include a sine curve, a square wave or a pyramidal wave.

In example embodiments, the apparatus of fabricating a semiconductor device may further include a de-chucking gas tube supplying a de-chucking gas to a backside of the wafer passing through the electrostatic chuck which may be supplied before application of the first and second de-chucking voltages, and a flowmeter measuring a leakage amount of the de-chucking gas leaked out between the wafer and the electrostatic chuck that may be used to measure the leakage after application of the first and second de-chucking voltages, and connected to the de-chucking gas tube. The wafer may be de-chucked if the measured leakage amount is larger than a tolerance leakage amount.

In example embodiments, the de-chucking gas includes an inert gas.

In example embodiments, the apparatus of fabricating a semiconductor device may further include a controller connected to the first and second de-chucking voltage suppliers. The controller may receive identifying information of the wafer when the wafer is chucked, and set a polarity and a value of the first de-chucking voltage and a waveform and an absolute value of the second de-chucking voltage based on the identifying information for the wafer.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
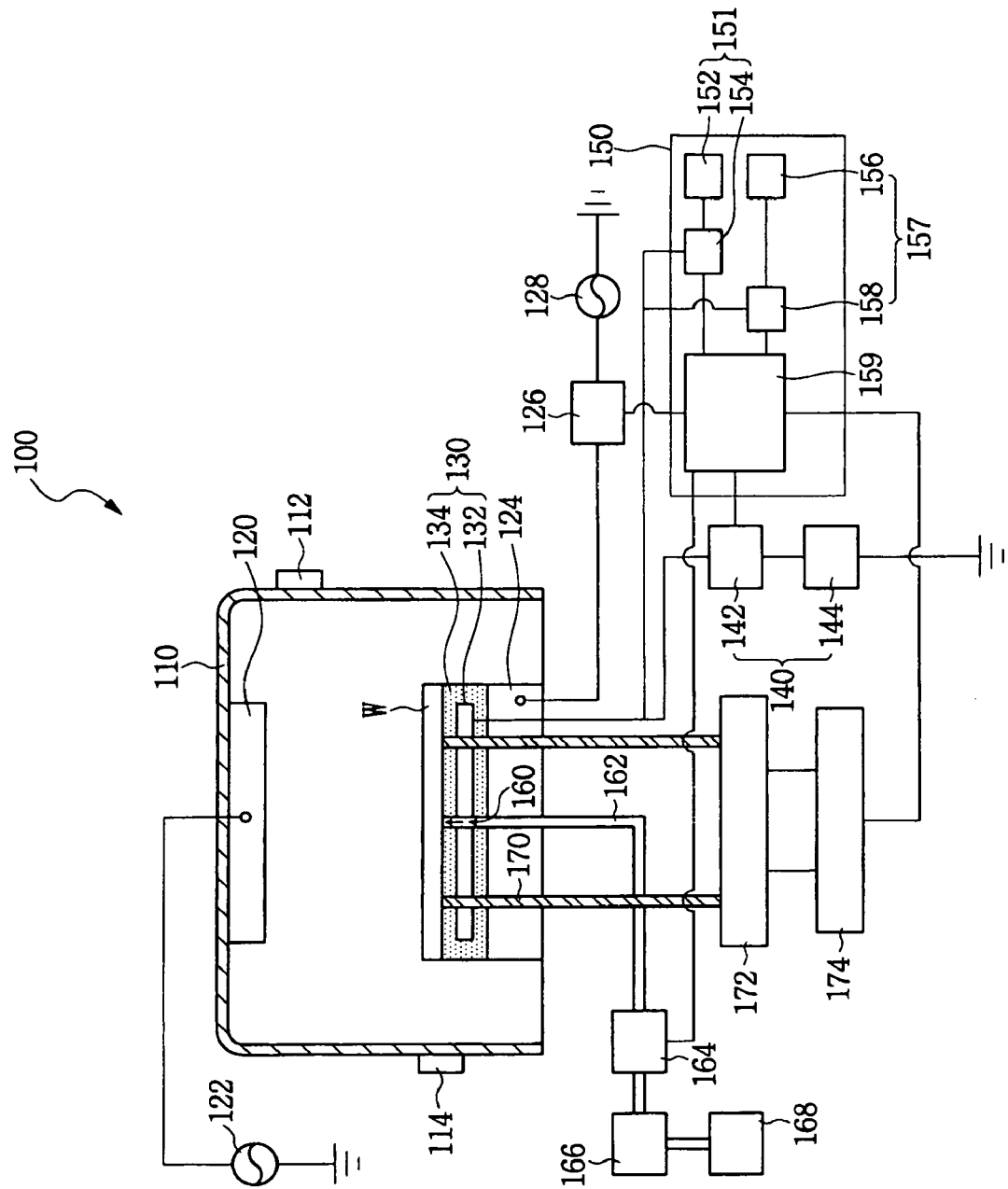
FIG. 1 is a schematic diagram showing an apparatus for fabricating a semiconductor device in accordance with example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Referring now to the drawings, an apparatus for fabricating a semiconductor device in accordance with example embodiments will be illustrated. FIG. 1 is a schematic diagram of an apparatus for fabricating a semiconductor device in accordance with example embodiments.

Referring to FIG. 1, an apparatus 100 for fabricating a semiconductor device in accordance with example embodiments may include a chamber 110 having a space for performing a depositing process, a dry etching process or an ion implantation process for a wafer (W). The chamber 110 may include an anodizing layer (Alumilite) on its inner wall. The wafer (W) may be inputted into or outputted from the chamber 100 through a sidewall of the chamber 110 by a conveying unit.

Upper and lower electrodes 120 and 124 may be disposed at upper and lower regions in the chamber 110. The upper and lower electrodes 120 and 124 may be disposed within chamber 100, and may be electrically connected to RF generators 122 and 128 so that a high frequency alternating current power may be supplied. In addition, a switching unit 126 may be disposed between the lower electrode 124 and the RF generator 128 so as to electrically connect to the lower electrode 124 and the RF generator 128. The high frequency alternating current power may be interrupted or supplied to the lower electrode 124 by switching the switching unit 126. According to example embodiments, even though the upper electrode 120 may be electrically connected to the RF generator 122, the upper electrode 120 may be grounded through the chamber 110.

When the apparatus 100 is used as a dry etching apparatus, a high frequency alternating current power may be supplied to the upper and lower electrodes 120 and 124, and reaction source gas and plasma source gas may be injected to the wafer (W) through a reaction gas inlet 112 located in a sidewall of the chamber 110 for performing a dry etching process. The plasma source gas may be, for example, an Argon gas. After the injection of the reaction source gas and the plasma source gas to the wafer (W), plasma may be generated between the upper and lower electrodes 120 and 124 so that the dry etching process may be performed on the wafer (W). By-products generated through the dry etching process may be exhausted through an outlet 114. When the apparatus 100 is used as a depositing apparatus for performing a sputtering process, an inert gas such as an Argon-series gas may collide with a target material disposed on the upper electrode 120 so that plasma may be generated between the upper and lower electrodes 120 and 124.

Before performing the dry etching or sputtering process above, the wafer (W) may be disposed on an electrostatic chuck 130 which may be positioned on the lower electrode 124. The electrostatic chuck 130 may be a device fixing the wafer (W) by using a voltage. The electrostatic chuck 130 may include an electrostatic electrode 132 and an insulating layer 134 covering the electrostatic electrode 132.

The electrostatic electrode 132 may include a conductive plate. Further, the electrostatic electrode 132 may be either a unipolar type or a bipolar type electrode. For illustrative purposes only, example embodiments provide an electrostatic electrode 132 that may be a unipolar type. The wafer (W) may be disposed on a top surface of the insulating layer 134 insulating the wafer (W) from the electrostatic electrode 132. The insulating layer 134 may be a material having increased insulating property, for example, polyimide, ceramic or alumina doped with aluminum nitride, boron nitride, titanium oxide or chromium oxide.

The electrostatic electrode 132 may be electrically connected to a chucking voltage supplier 140. The chucking voltage supplier 140 may include a chucking voltage generator 144 and a chucking switcher 142 that may be interposed between the electrostatic electrode 132 and the chucking voltage generator 144. The chucking switcher 142 may be electrically connected to the electrostatic electrode 132 and the chucking voltage generator 144. A voltage of the chucking voltage generator 144 may be supplied or interrupted to the electrostatic electrode 132 by switching the chucking switcher 142.

For example, the chucking switcher 142 may be switched on after the wafer (W) placed in the chamber 110 and disposed on the electrostatic chuck 130. The chucking voltage generator 144 provides the electrostatic electrode 132 with a chucking voltage which may be a direct voltage with a given polarity. Alternatively, the wafer (W) may be electrically charged to have a different polarity from the electrostatic electrode 132 by virtue of plasma generated between the upper electrode 120 and the wafer (W). Because the wafer (W) and the electrostatic electrode 132 may have different polarities from each other, an electrostatic force may be generated between them. In other words, the wafer (W) may be chucked by the electrostatic chuck 130.

The electrostatic electrode 132 may be electrically connected to a de-chucking voltage supplier 150. The de-chucking voltage supplier 150 may include a first de-chucking voltage supplier 151 and a second de-chucking voltage supplier 157. The first and second de-chucking voltage suppliers 151 and 157 may generate first and second de-chucking voltages, respectively. The first and second de-chucking voltage suppliers 151 and 157 may apply the first and second de-chucking voltages to the electrostatic electrode 132 through a controller 159. The first and second de-chucking voltages may be applied at different voltage applying times by the controller 159. In other words, the controller 159 may control a voltage applying order, such that controller 159 determines which one of the first and second de-chucking voltages is first applied. In order to simplify the explanation, hereinafter applying voltages to the electrostatic electrode 132 with an order of the first de-chucking voltage, followed by the second de-chucking voltage, will be illustrated.

The first de-chucking voltage supplier 151 may include a first de-chucking voltage generator 152 and a first de-chucking switcher 154 interposed between the electrostatic electrode 132 and the first de-chucking voltage generator 152. The first de-chucking switcher 154 may be electrically connected to the electrostatic electrode 132 and the first de-chucking voltage generator 152. The first de-chucking switcher 154 may be switched on or switched off by the controller 159 so that an electric power of the first de-chucking voltage generator 152 may be supplied or interrupted.

For example, after the dry etching or depositing process of the wafer (W) is accomplished, the chucking switcher 142 may be switched off by the controller 159 and the first de-chucking switcher 154 may be switched on. The first de-chucking voltage generator 152 applies the first de-chucking voltage to the electrostatic electrode 132. A direct voltage having a different polarity from the chucking voltage of the chucking voltage generator 144 may be applied to the electrostatic electrode 132. According to a process condition of the dry etching process or the depositing process, the first de-chucking voltage may be a direct voltage having a constant value, or the first de-chucking voltage may be a direct voltage that converges to a zero value from an initial value of more than zero. Further, the first de-chucking voltage may also have a value of zero. Thus, charges having the polarity of the chucking voltage may be decreased in the electrostatic electrode 132. Correspondingly, charges having a different polarity from the electrostatic electrode 132 may be decreased in the wafer (W). In other words, the electrostatic force may be reduced between the wafer (W) and the electrostatic electrode 132.

Similarly, the second de-chucking voltage supplier 157 may include a second de-chucking voltage generator 156 and a second de-chucking switcher 158 interposed between the electrostatic electrode 132 and the second de-chucking voltage generator 156. The second de-chucking switcher 158 may be electrically connected to the electrostatic electrode 132 and the second de-chucking voltage generator 156. The second de-chucking switcher 158 may be switched on or switched off by the controller 159 so that an electric power of the second de-chucking voltage generator 156 may be supplied or interrupted.

For example, the first de-chucking switcher 154 may be switched off by the controller 159 after applying the first de-chucking voltage to the electrostatic electrode 132, and the second de-chucking switcher 158 may be switched on. The second de-chucking voltage generator 156 applies the second de-chucking voltage, namely, an alternating voltage varying periodically in polarity, to the electrostatic electrode 132. According to a process condition of the dry etching process or the depositing process, the second de-chucking voltage may be an alternating voltage having a constant absolute value, or an alternating voltage that converges to a zero value from an initial value of more than zero. The alternating voltage may be a sine curve, a square wave or a pyramidal wave. Thus, after applying the first de-chucking voltage to the electrostatic electrode 132, charges remaining in the electrostatic electrode 132 may be reduced. More specifically, after applying the direct voltage having a different polarity from the chucking voltage to the electrostatic electrode 132, charges having a different polarity from the first de-chucking voltage may remain in the electrostatic electrode 132. Alternatively, the electrostatic electrode 132 may be electrically charged with charges having a same polarity as the first de-chucking voltage. Consequently, the electrostatic force between the wafer (W) and the electrostatic chuck 130 may be present in a small quantity. Thus, since the second de-chucking voltage employs an alternating voltage, the charges in the electrostatic electrode may still remain, while varying periodically in polarity, but the charges will be reduced after a period of time. Further, in the case of employing a second de-chucking voltage of an alternating voltage converging to zero, the charges in the electrostatic electrode may be completely extinguished. Thus, the electrostatic force between the wafer (W) and the electrostatic electrode 132 may also be extinguished.

As illustrated above, the controller 159 may control not only the first and second de-chucking switchers 154 and 158, but also operations relevant to the de-chucking of the wafer (W). For example, before the wafer (W) may be loaded into the chamber 110, the controller 159 may receive identifying information of the wafer (W) from the apparatus 100. The identifying information may be recorded in a bar code provided on a surface of the wafer (W) or a Lot Identity unit (ID) of a cassette containing the wafer (W), etc. The identifying information may include a process condition and a process history for the wafer. Here, the controller 159 may set a polarity, a value and an applying time of the first de-chucking voltage based on the identifying information for the wafer. In addition, the controller 159 may also set a waveform, an absolute value and an applying time of the second de-chucking voltage based on the identifying information.

Meanwhile, a de-chucking gas supplying hole 160 passing through both the lower electrode 124 and the electrostatic chuck 130 may be disposed in the electrostatic chuck 130. A first end of a de-chucking gas tube 162 may be connected to the de-chucking gas supplying hole 160. Further, a second end of the de-chucking gas tube 162 may be connected to a gas supplier 168. De-chucking gas may be stored in the gas supplier 168. The de-chucking gas may be an inert gas, for example, helium gas. The de-chucking gas may be supplied to a backside of the wafer (W) after being injected into the de-chucking gas supplying hole 160 through the de-chucking gas tube 162.

The de-chucking gas may contribute to separation of the wafer (W) and the electrostatic chuck 130 upon the de-chucking of the wafer (W). The de-chucking gas supplied to the wafer (W) may leak between the wafer (W) and the electrostatic chuck 130 upon the application of the first and second de-chucking voltages. The leakage amount and pressure of the de-chucking gas may be measured by both a flowmeter 164 and a pressure measurer 166 which may be installed in the de-chucking gas tube 162. Information of the measured leakage amount of the de-chucking gas may be provided to the controller 159. The controller 159 may have a program comparing a tolerance leakage amount of the de-chucking gas with the measured leakage amount thereof. When the measured leakage amount is larger than the tolerance leakage amount, the controller 159 may control a plurality of lift-pins 170 to ascend upward so that the wafer (W) may be de-chucked from the electrostatic chuck 130.

In addition, the de-chucking gas may not only contribute to de-chucking of the wafer (W), but may also be provided to the wafer (W) while the dry etching process or the deposing process may be performed on the wafer (W). Here, the de-chucking gas may be used as a gas cooling the wafer (W) heated during the process. Thus, a temperature of the wafer (W) may be constantly maintained.

In addition, the lift-pins 170 may be disposed to pass through the lower electrode 124 and the electrostatic chuck 130. The lift-pins 170 may support a bottom surface of the wafer (W) and act either to raise or lower the wafer (W). The lift-pins 170 may be supported by a pin-supporting plate 172 disposed therebelow. The pin-supporting plate 172 may be raised or lowered by a pin-driving unit 174. When the pin-supporting plate 172 ascends or descends, the lift-pins 170 may also be raised or lowered. The pin-driving unit 174, as a cylinder, may be controlled by the controller 159.

Figure 2:
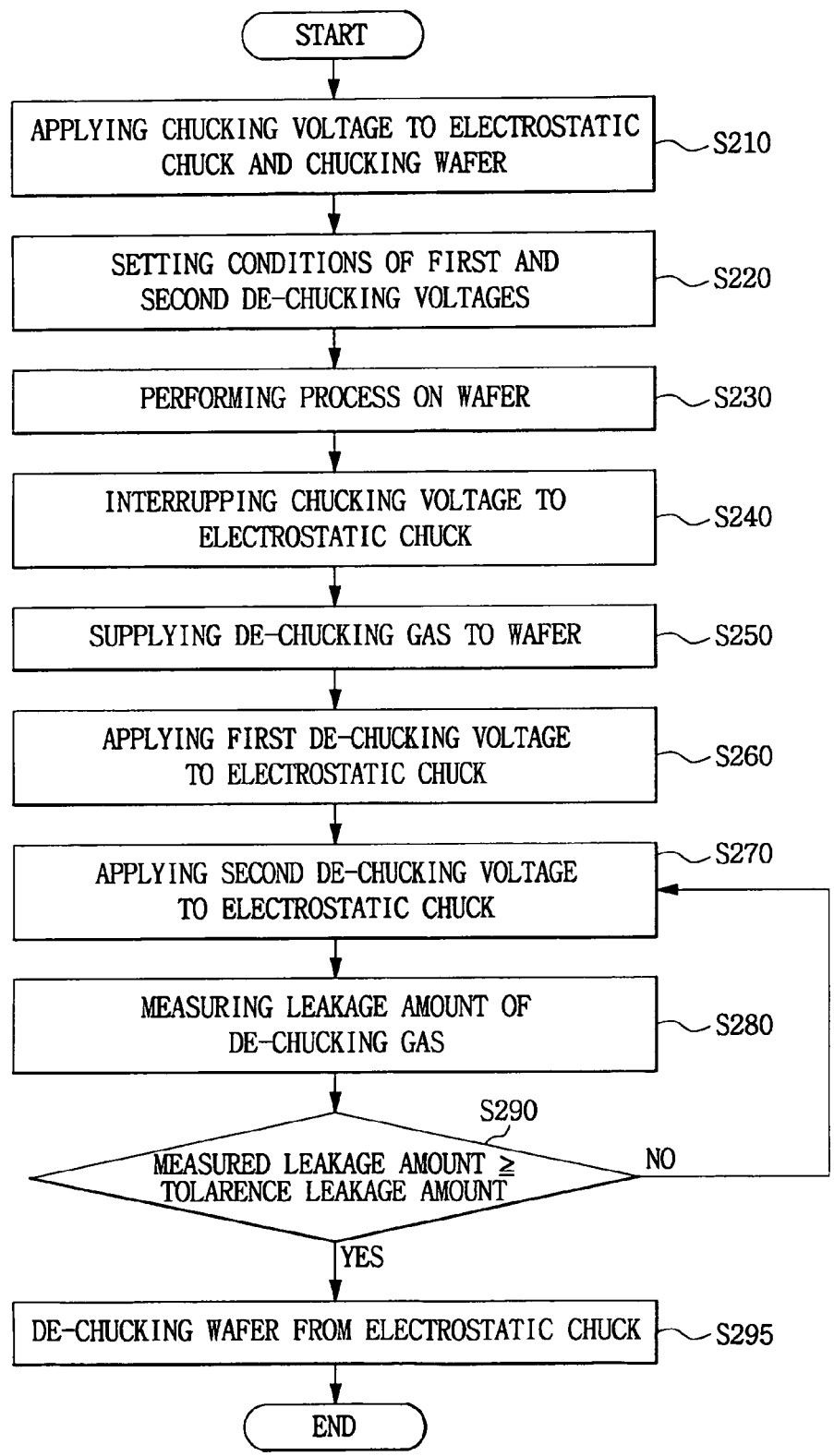
FIG. 2 is a flow chart illustrating a method of de-chucking a wafer in accordance with example embodiments.

Hereinafter a method of de-chucking a wafer in accordance with example embodiments may be illustrated with reference to FIGS. 1 through 4E. FIG. 2 is a flow chart illustrating a method of de-chucking a wafer in accordance with example embodiments. FIGS. 3A through 3D are schematic diagrams illustrating an operation of de-chucking a wafer from an electrostatic chuck in accordance with example embodiments. FIG. 3E is an extended diagram showing a portion of "A" of FIG. 3D. FIGS. 4A through 4E are graphs illustrating voltage changes applied to an electrostatic chuck in accordance with example embodiments.

Referring to FIGS. 1 through 3A, a wafer (W) may be introduced into a chamber 110 by a conveying unit such as robot-arm (not shown). Simultaneously, lift-pins 170 may be raised from an electrostatic chuck 130 through a control of a controller 159 so that the wafer (W) may be loaded on the lift-pins 170. Then, the lift-pins 170 may be lowered so that the wafer (W) may be loaded for contacting a surface of the electrostatic chuck 130. Next, a chucking voltage may be applied to an electrostatic electrode 132 of the electrostatic chuck 130 from the chucking voltage supplier 140. For example, as illustrated in FIGS. 4A through 4E, the chucking voltage may be a direct voltage having a negative polarity of a constant value (V1) from a start process time to a process time t1. Here, the electrostatic electrode 132 may be electrically charged with charges having a negative polarity. Correspondingly, charges having a positive polarity may be induced to the wafer (W). Consequently, an electrostatic force having attraction may be generated between the wafer (W) and the electrostatic chuck 130 so that the wafer (W) may be chucked to the electrostatic chuck 130. Meanwhile, before the wafer (W) may be loaded to the chamber 110, a reader (not shown) installed outside of the chamber 110 may read identifying information for the wafer (W) and transmit the identifying information of the wafer (W) to a controller 159. The identifying information of the wafer (W) may include a process condition and a pre-process history for the wafer. The above-mentioned may be performed in S210.

Next, the controller 159 may set conditions of a de-chucking voltage based on the identifying information for the wafer (W). For example, as illustrated in FIGS. 4A through 4E, the controller 159 may set a polarity, a value, and an applying time of the first de-chucking voltage, based on the identifying information for the wafer. In addition, the controller 159 may also set a waveform, an absolute value, and an applying time of a second de-chucking voltage, based on the identifying information for the wafer. Thus, the conditions of the first and second de-chucking voltages may be effectively set in S220, based on consideration of an applying time of the chucking voltage that may occur in S210. Consideration of the applying time for the chucking voltage may include the voltage that is to be applied during a process and a layering of the backside of the wafer (W).

A process may be performed on the wafer in S230. The process may include a depositing process, a dry etching process or an ion implantation process using plasma. During the process, a cooling gas may be supplied to the backside of the wafer (W) through a de-chucking gas supplying hole 160 connected to one end of a de-chucking gas tube 162. The cooling gas may be an inert gas such as helium gas. The cooling gas acts as a de-chucking gas.

Figure 3A:
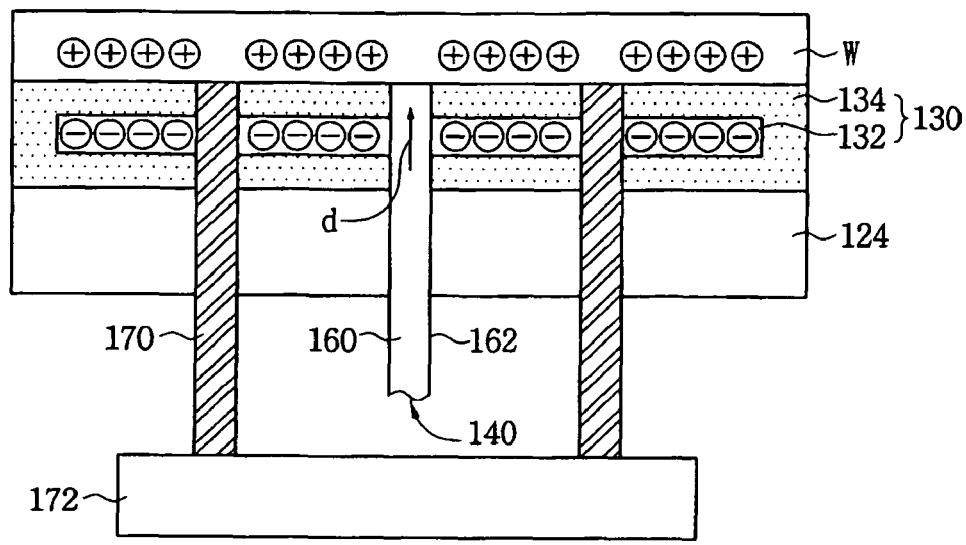
FIGS. 3A through 3D are schematic diagrams illustrating an operation of de-chucking a wafer from an electrostatic chuck in accordance with a method of example embodiments.
Figure 3B:
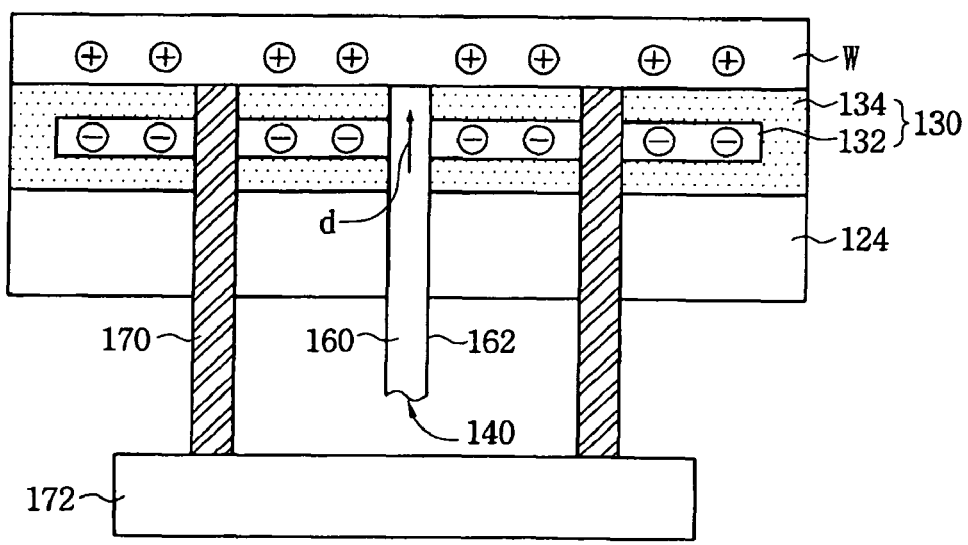

Referring to FIGS. 1 and 3B, after completing the process, the chucking voltage may be interrupted to the electrostatic electrode 132 in S240, and the de-chucking gas (d) may be continuously supplied to the backside of the wafer (W) through the de-chucking gas supplying hole 160 in S250. The de-chucking gas (d) may act as the cooling gas (d) during the process. Here, the de-chucking gas (d) may contribute to separation of the wafer (W) from the electrostatic chuck 130.

Figure 4A:
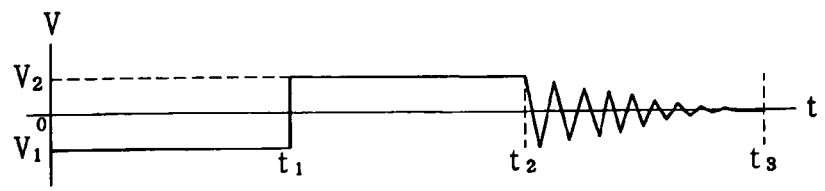
FIGS. 4A through 4E are graphs illustrating voltage changes applied to an electrostatic chuck in accordance with a method of example embodiments.
Figure 4B:
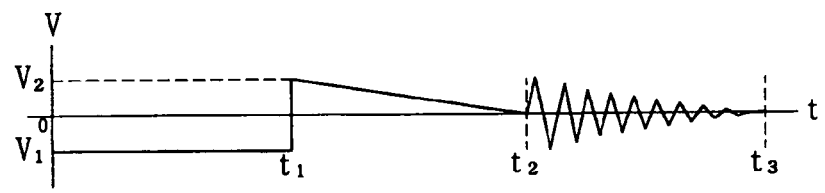
Figure 4C:
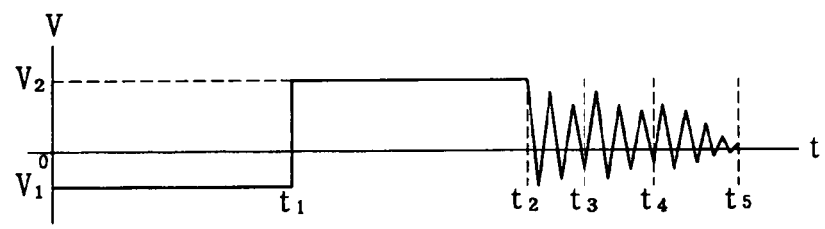
Figure 4D:
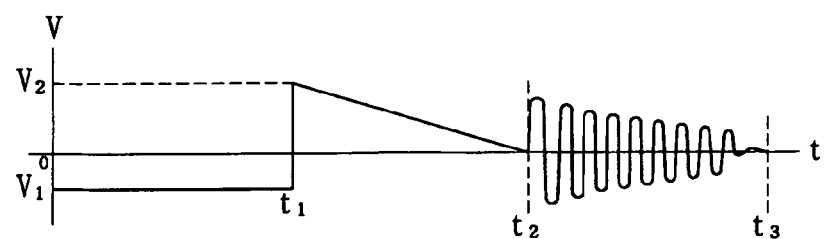
Figure 4E:

Next, the controller 159 may switch on the first de-chucking switcher 154 so that the first de-chucking voltage of the first de-chucking voltage supplier 151 may be applied to the electrostatic electrode 132 in S260. The first de-chucking voltage may have a different polarity from the chucking voltage, for example, a direct voltage having a positive polarity or zero value, according to a condition based on the identifying information for the wafer. That is to say, in the case where the first de-chucking voltage is the direct voltage having the positive polarity, the first de-chucking voltage may have a constant value (V2) between process times t1 and t2 as illustrated in FIGS. 4A and 4C, or the first de-chucking voltage may converge to a zero value from the constant value (V2) over the process times t1 and t2 as illustrated in FIGS. 4B and 4D. Then, in the case where the first de-chucking voltage is a zero value over the process times t1 and t2, the controller 159 may switch off the first de-chucking switcher 154 so as not to apply the first de-chucking voltage to the electrostatic electrode 132, as illustrated in FIG. 4E. Consequently, negative charges electrically charged in the electrostatic electrode 132 may be reduced, and correspondingly, positive charges may also be reduced in the wafer (W). Thus, the electrostatic force may be decreased between the wafer (W) and the electrostatic electrode 132.

Referring to FIGS. 1 and 3C through 3E, the controller 159 may control a second de-chucking switcher 158 to switch on so as to apply a second de-chucking voltage of a second de-chucking voltage supplier 157 to the electrostatic electrode 132 in S270. The second de-chucking voltage may be an alternating voltage varying periodically in polarity. The second de-chucking voltage, as illustrated in FIGS. 4A, 4B, 4D and 4E, may be an alternating voltage having a constant absolute value over process times t2 and t3 according to a condition based on the identifying information, or an alternating voltage that converges to a zero value from an initial absolute value of more than zero. In addition, the alternating voltage may be a pyramidal wave or a sine wave according to the condition based on the identifying information, as illustrated in FIGS. 4A, 4B, 4D and 4E. The alternating voltage may be a square wave.

In example embodiments, the second de-chucking voltage, as illustrated in FIG. 4C, may include first, second and third alternating voltages which may be sequentially applied to the electrostatic electrode 132. The first, second and third alternating voltages may be generated between the process times t2 and t3, between selected process times t3 and t4 and between the remaining process times t4 and t5, respectively. Specifically, the first alternating voltage between t2 and t3 may have a greater absolute value than the second alternating voltage between t3 and t4. In addition, the first and second alternating voltages may have waves that reduce gradually. Here, a peak absolute value of the second alternating voltage may be smaller than that of the first alternating voltage. A peak absolute value of the second alternating voltage, may be greater than that of the third alternating voltage as illustrated in FIG. 4C.

Figure 3C:
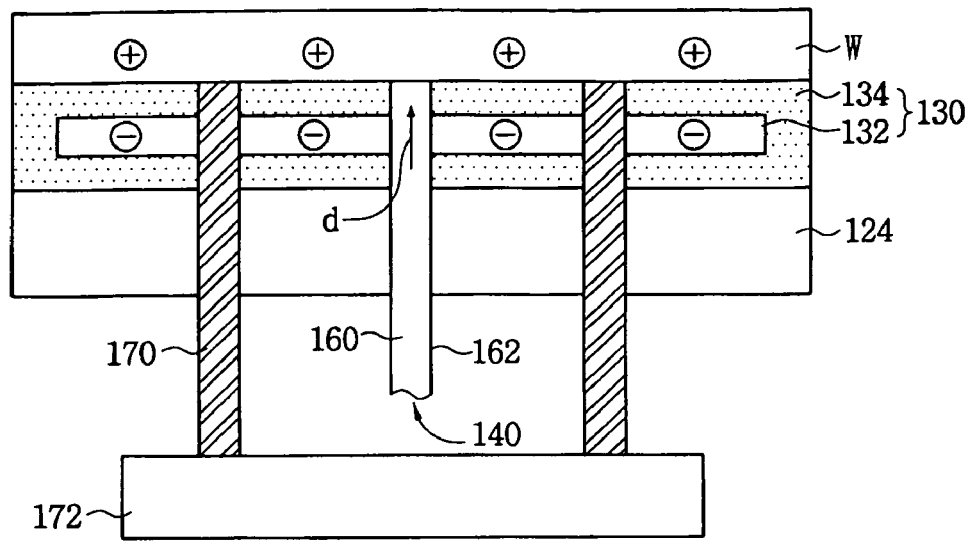
Figure 3D:
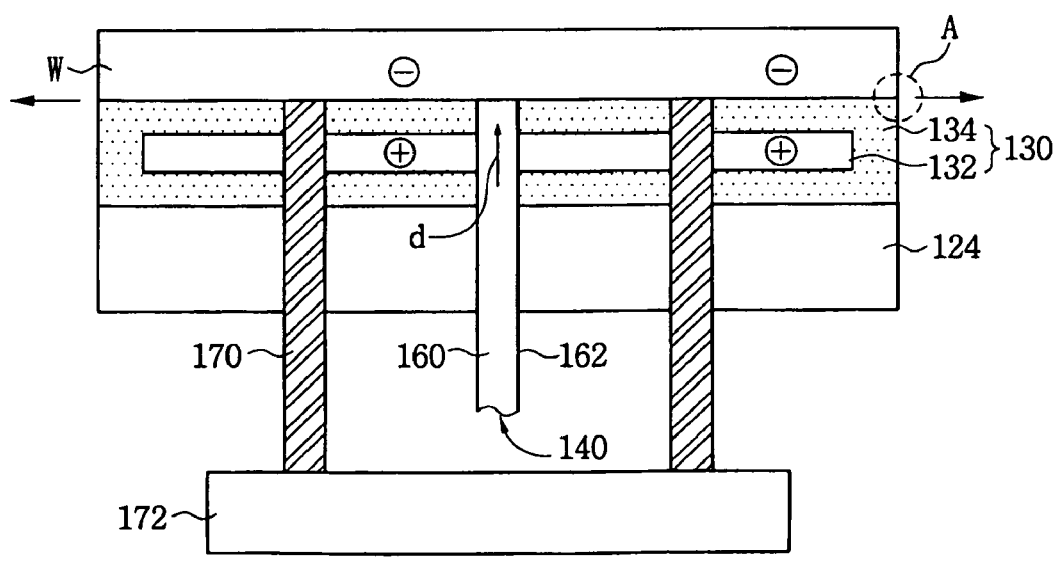
Figure 3E:
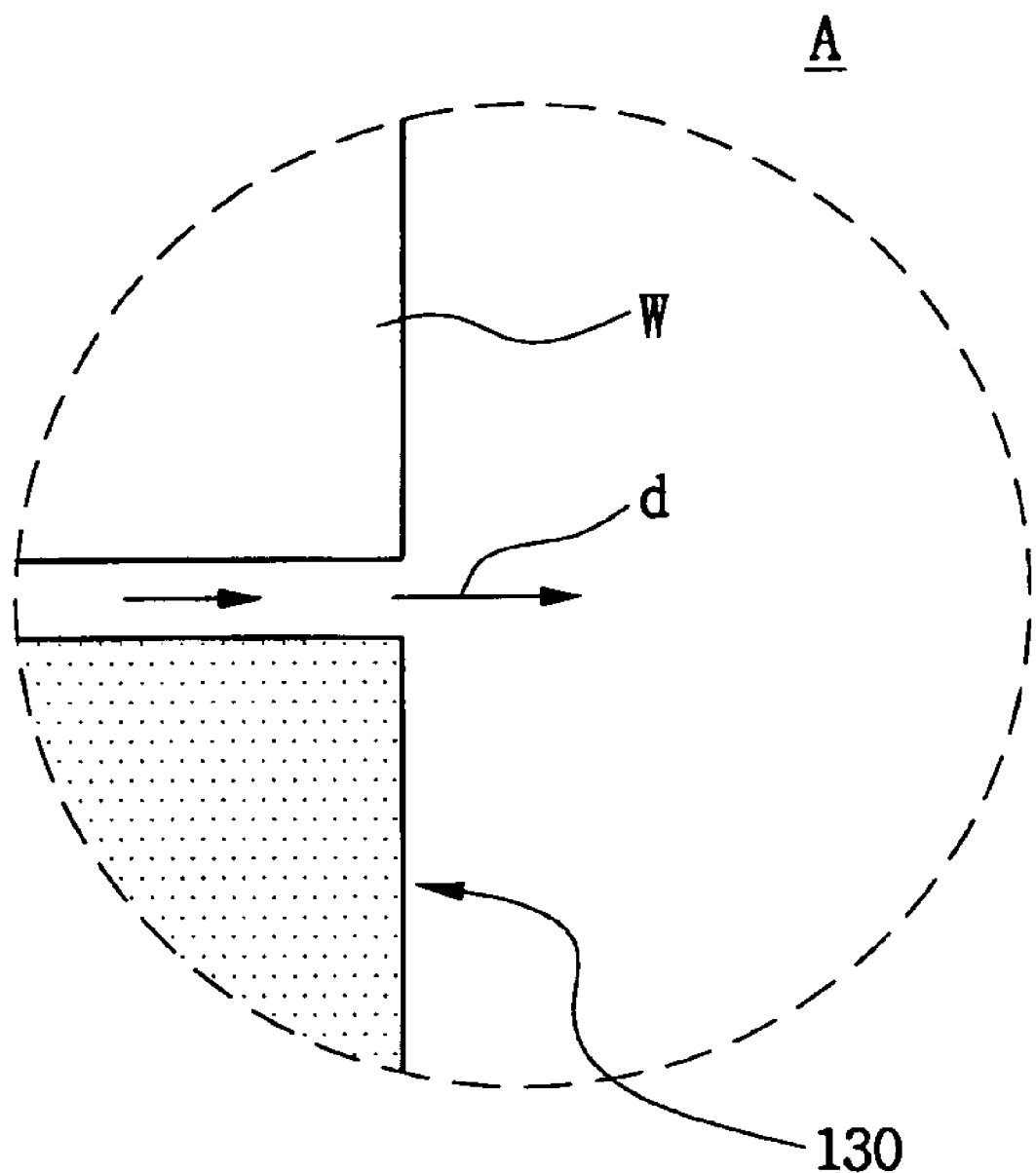
FIG. 3E is an extended diagram showing the portion of "A" of FIG. 3D.

As mentioned above, positive or negative charges may remain in the electrostatic electrode 132 by applying the second de-chucking voltage. For example, in the case that negative charges remain in the electrostatic electrode 132 as illustrated in FIG. 3B, the negative charges in the electrostatic electrode 132 may be greatly reduced as illustrated in FIG. 3C, by applying the alternating voltage having a positive polarity as illustrated in FIG. 4A. However, when the positive polarity may be maintained for a long period of time, positive charges may be electrically charged in the electrostatic electrode 132. Here, the positive charges in the electrostatic electrode 132 may be reduced as illustrated in FIG. 3D, by applying the alternating voltage having a negative polarity as illustrated in FIG. 4A. Thus, the charges having positive or negative polarity may be reduced in the electrostatic electrode 132 due to the alternating voltage varying periodically in polarity. In example embodiments, the first de-chucking voltage may be applied before the second de-chucking voltage, although the order may be changed.

Next, the de-chucking gas supply to the backside of the wafer (W) may be leaked out between the wafer (W) and the electrostatic chuck 130 as the electrostatic force may be decreased by the first and second de-chucking voltages, as illustrated in FIG. 3E. Here, a flowmeter 164 installed in a de-chucking gas tube 162 of FIG. 1 may measure a leakage amount of the de-chucking gas (d) in S280. Information of the measured leakage amount of the de-chucking gas (d) may be provided to the controller 159.

Next, the controller 159 may compare the measured leakage amount of the de-chucking gas (d) with a tolerance leakage amount thereof in S290. When the measured leakage amount is smaller than the tolerance leakage amount, the second de-chucking voltage may be applied to the electrostatic electrode 132. On the other hand, when the measured leakage amount is larger than the tolerance leakage amount, the controller 159 may interrupt the supply of the second de-chucking voltage and make the lift-pins 170 ascend. In addition, the de-chucking gas may contribute to effectively perform the de-chucking of the wafer (W). Accordingly, the wafer (W) may be de-chucked from the electrostatic chuck 130 without any damage or breakage.

According to example embodiments, a direct voltage and an alternating voltage which have a different polarity from the chucking voltage may be applied to an electrostatic chuck when a wafer is de-chucked, so that charges remaining in the electrostatic chuck while performing a process may be extinguished and an electrostatic force may be eliminated between the wafer and the electrostatic chuck. Consequently, the separation of the wafer from the electrostatic chuck may not be interrupted during the de-chucking of the wafer. In conclusion, damage or breakage of the wafer during the de-chucking of the wafer may be reduced so that a manufacturing yield of semiconductor devices may be improved.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of de-chucking a wafer comprising:
   interrupting a chucking voltage applied to an electrostatic chuck;
   applying a first de-chucking voltage to the electrostatic chuck, the first de-chucking voltage having one of a different polarity from the chucking voltage and a zero value;
   applying a second de-chucking voltage to the electrostatic chuck, the second de-chucking voltage varying in polarity;
   supplying a de-chucking gas to a backside of the wafer, before the application of the first and second de-chucking voltages to the electrostatic chuck;
   measuring a leakage amount of the de-chucking gas leaked out between the wafer and the electrostatic chuck, after the application of the first and second de-chucking voltages to the electrostatic chuck; and
   de-chucking the wafer from the electrostatic chuck when the measured leakage amount of the de-chucking gas is larger than a tolerance leakage amount.

2. The method of claim 1, wherein the first de-chucking voltage having one of a different polarity from the chucking voltage includes a direct voltage that has a constant value, or a direct voltage that gradually converges to a zero value from an initial value having a value of more than zero.

3. The method of claim 1, wherein the second de-chucking voltage includes an alternating voltage that has a constant absolute value, or an alternating voltage that converges to a zero value from an initial value having an absolute value of more than zero.

4. The method of claim 1, wherein the second de-chucking voltage includes first, second and third alternating voltages, the first, second and third alternating voltages being generated at different process time intervals from one another, and the first, second and third alternating voltages being gradually reduced in order.

5. The method of claim 1, wherein the second de-chucking voltage includes a sine curve, a square wave or a pyramidal wave.

6. The method of claim 1, wherein the de-chucking gas comprises an inert gas.

7. The method of claim 1, further comprising:
   loading the wafer on the electrostatic chuck, before the interruption of the chucking voltage;
   applying the chucking voltage to the electrostatic chuck, before the interruption of the chucking voltage;
   transmitting identifying information of the wafer to a controller; and
   setting a polarity and a value of the first de-chucking voltage, and a waveform and an absolute value of the second de-chucking voltage, based on the identifying information for the wafer.

8. The method of claim 1, wherein the polarity of the second de-chucking voltage varies periodically.

9. An apparatus for fabricating a semiconductor device comprising:
   an electrostatic chuck configured to chuck a wafer under a chucking voltage;
   a de-chucking voltage supplier connected to the electrostatic chuck, wherein the de-chucking voltage supplier includes a first de-chucking voltage supplier and a second de-chucking voltage supplier, the first de-chucking voltage supplier configured to generate a first de-chucking voltage having one of a different polarity from the chucking voltage and a zero value, the second de-chucking voltage supplier configured to generate a second de-chucking voltage varying in polarity;
   a de-chucking tube supplying a de-chucking gas to a backside of the wafer, the de-chucking gas tube passing through the electrostatic chuck; and
   a flowmeter measuring a leakage amount of the de-chucking gas leaked out between the wafer and the electrostatic chuck, the flowmeter connected to the de-chucking gas tube, wherein the flowmeter is configured to indicate whether the wafer is to be de-chucked by assuring that the measured leakage amount is larger than a tolerance leakage amount.

10. The apparatus of claim 9, wherein the first de-chucking voltage having one of a different polarity from the chucking voltage includes a direct voltage that has a constant value, or a direct voltage that gradually converges to a zero value from an initial value of more than zero.

11. The apparatus of claim 9, wherein the second de-chucking voltage includes an alternating voltage that has a constant absolute value, or an alternating voltage that converges to a zero value from an initial absolute value of more than zero.

12. The apparatus of claim 9, wherein the second de-chucking voltage includes first, second and third alternating voltages, the first, second and third alternating voltages being generated at different process time intervals from one another, and the first, second and third alternating voltages being gradually reduced in order.

13. The apparatus of claim 9, wherein the second de-chucking voltage includes a sine curve, a square wave or a pyramidal wave.

14. The apparatus of claim 9, wherein the de-chucking gas comprises an inert gas.

15. The apparatus of claim 9, further comprising:
a controller connected to the first and second de-chucking voltage suppliers, wherein the controller is configured to receive identifying information for the wafer, and wherein the controller is configured to set a polarity and a value of the first de-chucking voltage, and a waveform and an absolute value of the second de-chucking voltage, based on the identifying information for the wafer.

16. The apparatus of claim 9, wherein the polarity of the second de-chucking voltage varies periodically.

* * * * *